(12) United States Patent
Wei et al.

(10) Patent No.: US 9,771,265 B2
(45) Date of Patent: Sep. 26, 2017

(54) METHODS FOR MANUFACTURING FULLERENES

(75) Inventors: Liangming Wei, Shanghai (CN); Yafei Zhang, Shanghai (CN)

(73) Assignee: EMPIRE TECHNOLOGY DEVELOPMENT LLC, Wilmington, DE (US)

(*) Notice: Subject to any disclaimer, the term of this patent is extended or adjusted under 35 U.S.C. 154(b) by 214 days.

(21) Appl. No.: 14/408,928

(22) PCT Filed: Jun. 27, 2012

(86) PCT No.: PCT/CN2012/077640
§ 371 (c)(1),
(2), (4) Date: Dec. 17, 2014

(87) PCT Pub. No.: WO2014/000185
PCT Pub. Date: Jan. 3, 2014

(65) Prior Publication Data
US 2015/0232339 A1 Aug. 20, 2015

(51) Int. Cl.
 *C01B 31/02* (2006.01)
 *C23C 14/06* (2006.01)
 *C23C 14/32* (2006.01)

(52) U.S. Cl.
 CPC .......... *C01B 31/0226* (2013.01); *C01B 31/02* (2013.01); *C23C 14/0605* (2013.01); *C23C 14/325* (2013.01); *C01P 2004/13* (2013.01); *C01P 2004/133* (2013.01)

(58) Field of Classification Search
 CPC . C01B 31/0226; C01B 31/02; C23C 14/0605; C23C 14/325; C01P 2004/13; C01P 2004/133
 See application file for complete search history.

(56) References Cited

U.S. PATENT DOCUMENTS

2003/0015414 A1   1/2003   Ata et al.

FOREIGN PATENT DOCUMENTS

JP   2007001810 A   1/2007
KR   20100076672     7/2010

OTHER PUBLICATIONS

English machine translation of JP2007001810.*
English machine translation of KR20100076672.*
International Search Report and Written Opinion; International Application No. PCT/CN2012/077640; dated Apr. 4, 2013, 10 pages.
Ebbesen, T.W., Large-scale synthesis of carbon nanotubes, *Nature*, Jul. 16, 1992; 358, 6383; ProQuest p. 220, 3 pages.

* cited by examiner

*Primary Examiner* — Richard M Rump
(74) *Attorney, Agent, or Firm* — Dorsey & Whitney LLP

(57) ABSTRACT

Methods are disclosed for manufacturing carbon rods from lignin scrap and for using such lignin-derived carbon rods for manufacturing carbon nanotubes in an arc discharge process.

14 Claims, 5 Drawing Sheets

METHODS FOR MANUFACTURING FULLERENES

CROSS-REFERENCE TO RELATED APPLICATON

This application is the U.S. National Phase under 35 U.S.C. §371 of International Application No. PCT/CN2012/077640, filed Jun. 27, 2012 entitled "METHODS FOR MANUFACTURING FULLERENES" which is incorporated herein by reference in its entirety.

BACKGROUND

Carbon nanotubes (CNTs) hold significant promise for use in the development of new technologies for national defense and consumer industries. This promise owes in part to the unique combination of nanoscale dimensions and superior chemical and physical properties exhibited by CNTs. Notably, advancements in the carbon nanotube field in the last decade owe much to the progress made in the purification of single-walled carbon nanotubes ("SWNT"), as cutting edge technologies benefit significantly from relatively pure materials. As such, efforts to improve the quality of SWNT are ongoing.

SUMMARY

In some embodiments, a method for producing carbon rods is disclosed. The method may include: vaporizing a solution or suspension comprising lignin containing sulfur to generate a residue; combining the residue with a catalyst to form a mixture; compressing the mixture to form one or more rods; drying the rods; and carbonizing the dried rods to produce carbon rods. The solution or suspension may be black water from a paper manufacturing process. The solution or suspension may include at least about 0.1% to about 30% by weight lignin. The step of vaporizing the solution or suspension may include heating the solution or suspension under a vacuum at a temperature of about 20° C. to about 300° C. The residue may include at least about 40% to about 99% by weight lignin. The step of compressing the mixture may include applying a pressure of about 1 atm to about 100 atm.

The catalyst used in the disclosed method for producing carbon rods may include one or more selected from Fe, Co, Ni, Yb, Cu, Au, Al, Si, Rh, Mn, Zn, Mg, Mo, Ru, and Ti, or an oxide thereof, such as $Al_2O_3$ and $SiO_2$. The catalyst may be present in the mixture at a concentration of about 0.01% to about 30% by weight.

The one or more carbon rods may have cross-sectional diameters of about 5 millimeters to about 5 centimeters. The one or more carbon rods may have lengths of about 5 millimeters to about 1 meter.

The step of drying the rods may include heating the rods under a vacuum or under an inert gas at a temperature of about 40° C. to about 600° C. The step of carbonizing the dried rods may include heating the dried rods under a vacuum or under an inert gas at a temperature of about 600° C. to about 3000° C.

The carbon rods produced by the disclosed methods may include at least about 0.01% to about 30% by weight sulfur. The sulfur may be substantially uniformly distributed in the carbon rods.

In one embodiment, a carbon rod electrode is disclosed. The carbon rod electrode may include lignin, sulfur, and a metal catalyst.

In another embodiment, a method is disclosed for manufacturing fullerenes. The method may include: providing first and second carbon rods, wherein at least the second rod comprises sulfur-containing lignin and optionally a catalyst; coupling the first rod to a cathode within an arc discharge reaction chamber; coupling the second rod to an anode within the arc discharge reaction chamber; adjusting the pressure within the chamber by actuating a vacuum pump and/or an inert gas inlet valve, such that the pressure is about $10^{-5}$ Pa to about $10^5$ Pa; and applying a current sufficient to create an arc between the first and second carbon rods, thereby causing fullerenes to deposit on the first carbon rod. The first carbon rod may have a larger volume than the second carbon rod. The current sufficient to create an arc may be a direct current.

The method may also include a step of harvesting the fullerenes deposited on the first carbon rod. The method may also include a step of purifying the harvested fullerenes. Purification may be accomplished by: oxidizing the harvested fullerenes in air at a temperature of about 200° C. to about 450° C. for about 1 minute to about 120 minutes; and refluxing the fullerenes with an acid at a temperature of about 10° C. to about 120° C. for about 1 minute to about 7 hours. The purity of the harvested fullerenes after purification may be at least about 70% to about 99% by weight. The yield of harvested fullerenes may be at least about 10% to about 90% by weight.

In some embodiments, the fullerenes are carbon nanotubes. In some embodiments, the carbon nanotubes produced by the disclosed method may be single-walled carbon nanotubes. In other embodiments, the carbon nanotubes may be multi-walled carbon nanotubes. In some embodiments, the fullerenes are buckyballs ($C_{60}$).

A carbon rod is disclosed in accordance with another embodiment. The carbon rod includes a compressed, dried and carbonized lignin residue having at least about 0.01% to about 30% sulfur by weight, in which the sulfur is substantially uniformly distributed within the carbon rod. This carbon rod may also include a metal catalyst.

Another method for manufacturing fullerenes is disclosed. This method may include: vaporizing a solution or suspension comprising lignin containing sulfur to generate a residue; combining the residue with a catalyst to form a mixture; compressing the mixture to form one or more rods; drying the rods; carbonizing the dried rods to produce at least a first carbon rod electrodes; coupling the first carbon rod electrode to an anode within an arc discharge reaction chamber; coupling a second carbon rod electrode to a cathode within the reaction chamber, wherein the cathode and the anode are separated by a gap; adjusting the gas pressure within the reaction chamber; and applying a direct current sufficient to create an arc across the gap between the cathode and the anode, thereby causing carbon nanotubes to deposit on the cathode.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
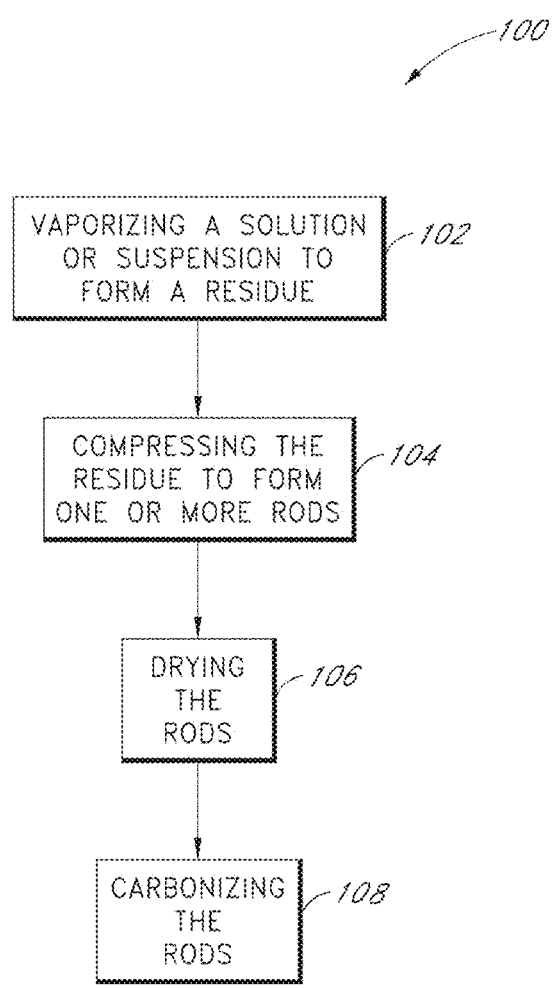
FIG. 1 is a flowchart showing one example of a method for manufacturing carbon rods.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Described herein are methods for utilizing waste lignin scrap, which often contains sulfur, to make carbon rod electrodes. These carbon rod electrodes may be made with or without added catalysts. The carbon rod electrodes may be used to generate fullerenes, such as carbon nanotubes, by an arc discharge process. These rods may, in some embodiments, advantageously provide purer fullerene compositions and/or greater fullerene yields. Both single-walled and multi-walled carbon nanotubes can be formed through this process.

Method for Producing Carbon Rods

FIG. 1 is a flowchart showing one example of a method for producing carbon rods 100. The method for producing carbon rods 100 includes: an operation "Vaporizing a solution or suspension to form a residue," illustrated in block 102; an operation "Compressing the residue to form one or more rods," illustrated in block 104; an operation "Drying the rods," illustrated in block 106; and an operation "Carbonizing the rods," illustrated in block 108. Although operations 102, 104, 106, and 108 may be performed sequentially, it will be appreciated that one or more of these operations may be performed at about the same time. These operations may also be performed in a different order than is depicted in FIG. 1.

At operation 102 "Vaporizing a solution or suspension to form a residue," an appropriate solution or suspension can be vaporized to isolate solid components. The solution or suspension can include lignin. For example, the solution or suspension can contain lignin scrap produced from standard paper manufacturing processes. In some embodiments, the lignin scrap is obtained from "black water" or "black liquor" produced in a paper manufacturing process. In some embodiments, the solution or suspension is "black water" or "black liquor" produced in a paper manufacturing process.

Black water is the spent cooking liquor that occurs while converting pulpwood into paper pulp. Black water is an aqueous solution of lignin residues, hemicellulose and other inorganic chemicals used in the process of paper manufacturing. Lignin is a chemical compound most commonly derived from wood, and forms an integral portion of cell walls of plants. Lignin is an organic polymer. Lignin can be removed from pulp during standard paper manufacturing processed to produce bleached paper. Lignin is typically removed by the "kraft process," or sulfate pulping.

The amount of lignin in the solution or suspension is not particularly limited. In some embodiments, the solution or suspension of lignin includes greater than about 0.1% lignin by weight. In some embodiments, the solution or suspension of lignin includes greater than about 1%, 5%, 10%, 15%, 20% or 25% lignin by weight. In some embodiments, the solution or suspension of lignin includes no more than about 30% lignin by weight. In some embodiments, the solution or suspension of lignin may include about 0.1% to about 30% lignin by weight.

In some embodiments, the lignin can be a sulfur-containing lignin. As used herein, a "sulfur-containing lignin" can be lignin intermixed with sulfur, lignin chemically bonded to a sulfur group (e.g., sulfonate), or a lignin salt having a counterion having a sulfur atom (e.g., sulfite). Without being bound to any particular theory, Applicants believe that sulfur-containing lignin may produce greater uniformity, purity and yield of fullerenes produce by arc discharge methods.

The conditions for vaporizing the solution or suspension are not particularly limited. In some embodiments, the solution or suspension is exposed to conditions effective to remove at least a portion of liquid in the solution or suspension. For example, the solution or suspension may be heated above a boiling point of one or more liquids in the solution or suspension. In some embodiments, the solution or suspension is heated to a temperature of greater than about 20° C. to vaporize the solvent leaving behind the residue. In some embodiments, the solution or suspension is heated to a temperature of at least about 40, 60, 80, 100, 120, 140, 160, 180, 200, 220, 240, 260, 280 or 300° C. to vaporize the solvent. In some embodiments, the solution or suspension is heated to a temperature of about 20° C. to about 300° C. to vaporize the solvent. The solution or suspension may also be vaporized under reduced pressure with or without additional heat to produce the residue.

The vaporizing process can, in some embodiments, generate a residue. In some embodiments, the residue may contain about 40%, 45%, 50%, 55%, 60%, 65%, 70%, 75%, 80%, 85% or 90% lignin by weight. In some embodiments, the resulting residue may include up to about 99% lignin by weight. This lignin may be a sulfur-containing lignin. In some embodiments, the sulfur content of the residue is greater than about 0.01% sulfur by weight. In some embodiments, the sulfur content is greater than about 0.05%, 0.1%, 0.5%, 1%, 2%, 3%, 4%, 5% 6%, 7%, 8%, 9% or 10% sulfur by weight. In some embodiments, the residue contains greater than about 0.01% sulfur by weight. The residue may contain up to about 10%, 15%, 20%, 25%, or 30% sulfur by weight. In some embodiments, the residue contains from about 0.01% sulfur to about 30% sulfur by weight.

The residue may optionally be subjected to comminution (e.g., grinding, cutting, ball milling, and the like) to aid further processing. In some embodiments, the residue may be comminuted into a particulate. The particulate may, for example, have an average diameter of less than or equal to about 2 mm; less than or equal to about 1 mm; less than or equal to about 500 µm; or less than or equal to about 250 µm.

Other components may optionally be combined with the residue. In some embodiments, a catalyst can be combined with the residue. The catalyst may be, for example, a transition metal catalyst. The catalyst may, in some embodiments, be one or more of Fe, Co, Ni, Yb, Cu, Au, $Al_2O_3$, $SiO_2$, Rh, Mn, Zn, Mg, Mo, Ru, and Ti. The catalyst might also be an oxide of one of the listed metals, or the oxide of another metal. The total amount of catalyst combined with the residue can be at least about 0.01%, 0.1%, 0.5%, 1%, 2%, 3%, 4%, 5%, 10%, 15%, 20%, 25% or 30% by weight. This catalyst may be present in a concentration of greater than about 0.01% by weight. The catalyst may be added at a concentration of up to about 30% by weight. In some embodiments, about 0.01% by weight to about 30% by weight of catalyst is combined with the residue.

A binder may also be optionally combined with the residue. The binder may provide adhesion between other components (e.g., particles of the residue). The binder can be, for example, asphalt, coal tar, cellulose, starch, sucrose, lignin, pitch, fructose or a resin. In some embodiments, the resin is a carbon-containing resin. In some embodiments, the resin is an epoxy or rubber. The amount of binder is not particularly limited, and can be, for example, from about 0.1% to about 20% by weight. The binder may be optionally added before or during any operation in the process, for example, as needed to obtain sufficient adhesion for processing. As an example, a binder may be mixed with the residue before molding. As another example, a binder can be applied to rods after molding to prevent fracturing of rods.

After optionally combining other components with the residue, the composition may contain about 40%, 45%, 50%, 55%, 60%, 65%, 70%, 75%, 80%, 85% or 90% lignin by weight. In some embodiments, the composition may include up to about 99% lignin by weight. As discussed above, the lignin can be a sulfur-containing lignin.

At operation 104 "Compressing the residue to form one or more rods," the residue can be formed into a rod. The rod may be formed, for example, using standard molding or extrusion techniques. As one example, the residue may be disposed into a rod-shaped mold and heated under pressure to form the rod.

The applied pressure is not particularly limited and may vary with the composition used (e.g., amount of binder). The compression may be accomplished by applying a pressure of at least about 100, 345, 500, 690, 1723, 3447, 5171, 6895, 8618 or 10000 kPa. In some embodiments, the applied pressure is about 100 kPa to about 10000 kPa. This may result in one or more rods. The catalyst might be a metal selected from the group consisting of Fe, Co, Ni, Yb, Cu, Au, Rh, Mn, Zn, Mg, Mo, Ru, and Ti. The catalyst might also be an oxide of one of the listed metals, or another oxide, such as $Al_2O_3$ or $SiO_2$. The catalyst is present in a concentration of at least about 0.01%, 0.1%, 0.5%, 1%, 2%, 3%, 4%, 5%, 10%, 15%, 20%, 25% or 30% by weight. This catalyst may be present in a concentration of greater than about 0.01% by weight. The catalyst may be added at a concentration of up to about 30% by weight. In some embodiments, the residue is compressed under pressure without a catalyst. In some embodiments, the sulfur may be substantially uniformly distributed in the carbon rods.

At operation 106 "Drying the rods," the rods can optionally be dried. In some embodiments, the rods may be dried by heating the rods to at least about 40, 80, 120, 160, 200, 240, 280, 320, 360, 400, 440, 480, 520, 560 or 600° C. The rods may be dried by heating at a temperature of up to about 600° C. In some embodiments, the rods are dried by heating under a reduced pressure or an inert gas, such as $N_2$, Ar, He, or mixtures thereof. The reduce pressure can be, for example, from about $10^{-5}$ Pa to about $10^4$ Pa. The rods may also be dried by placing the rods under a reduced pressure without heat, or by placing the rods under reduced pressure with an inert gas.

At operation 108 "Carbonizing the rods," the dried rods can be carbonized to form carbon rods. Carbonizing is the term for conversion of an organic substance into carbon or a carbon containing residue. This is generally done through the application of heat or by placement within a vacuum. In some embodiments, the rods may be carbonized by heating the rods at a temperature of about 600, 800, 1000, 1200, 1400, 1600, 1800, 2000, 2200, 2400, 2600, 2800 or 3000° C. In some embodiments, the rods may be carbonized by heating the rods at a temperature of about 600° C. to about 3000° C. The rods may also be carbonized by placing the rods under a vacuum with or without heat, or by placing the rods under conditions with an inert gas with or without heat. The rods may be carbonized, for example, using a furnace, such as a graphite furnace or a rotary electric furnace.

Although operation 108 is shown as occurring after forming the rod, the skilled artisan, guided by the teachings of the present application, will appreciate that the residue may be carbonized before compression (e.g., operation 108 occurs before operation 104 depicted in FIG. 1). In some embodiments, the process may include two or more carbonization steps. For example, the residue may be subjected to carbonization and then the rod may be subjected to carbonization.

In some embodiments, the carbon rods obtained by any of the methods disclosed in the present application (e.g., a rod formed according to process 100 depicted in FIG. 1) may be suitable for use as electrodes in arc discharge processes for forming fullerenes. Without being bound to any particular theory, the fullerenes (e.g., carbon nanotubes) may be obtained by catalytic decomposition of hydrocarbons on metal particles, and can sometimes be filled with metallic particles. First, the hydrocarbon can be adsorbed on the metal surface and decomposed to produce carbon species. These species dissolve and diffuse through the metallic particle and precipitate at the rear face of the particle. This precipitate forms the fullerenes. U.S. Publication No. 2003/0015414 and U.S. Pat. No. 6,149,775 both disclose examples of standard arc discharge methods for producing fullerenes.

The dimensions of the rods are not particularly limited and can be adjusted, for example, by using different molds. The rods may have cross-sectional diameters of, for example, at least about 1 mm, at least about 5 mm, at least about 10 mm, at least about 15 mm, at least about 25 mm, at least about 30 mm, at least about 35 mm, at least about 40 mm, at least about 45 mm, or at least about 50 mm. The rods may have cross-sectional diameters of, for example, less than or equal to about 1 m, less than or equal to about 500 mm, less than or equal to about 250 mm, less than or equal to about 100 mm, or less than or equal to about 50 mm. In some embodiments, the rods may have cross-sectional diameters from about 1 mm to about 1 m. These rods might have lengths of about 5, 50, 100, 150, 200, 250, 300, 350, 400, 450, 500, 550, 600, 650, 700, 750, 800, 850, 900, 950, 1000 mm, or ranges between any two of these values. The rods may have an aspect ratio of at least about 5, at least about 10, or at least about 20. In some embodiments, the length of the rods is about 5 mm to about 1 meter. In some embodiments, the carbon rods formed in process 100 may differ in dimensions from one another. In some embodiments, the sulfur in the carbon rods may be substantially uniformly distributed throughout the carbon rods, e.g., containing about 0.01% to about 30% sulfur by weight.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Method for Manufacturing Carbon Nanotubes

Figure 2:
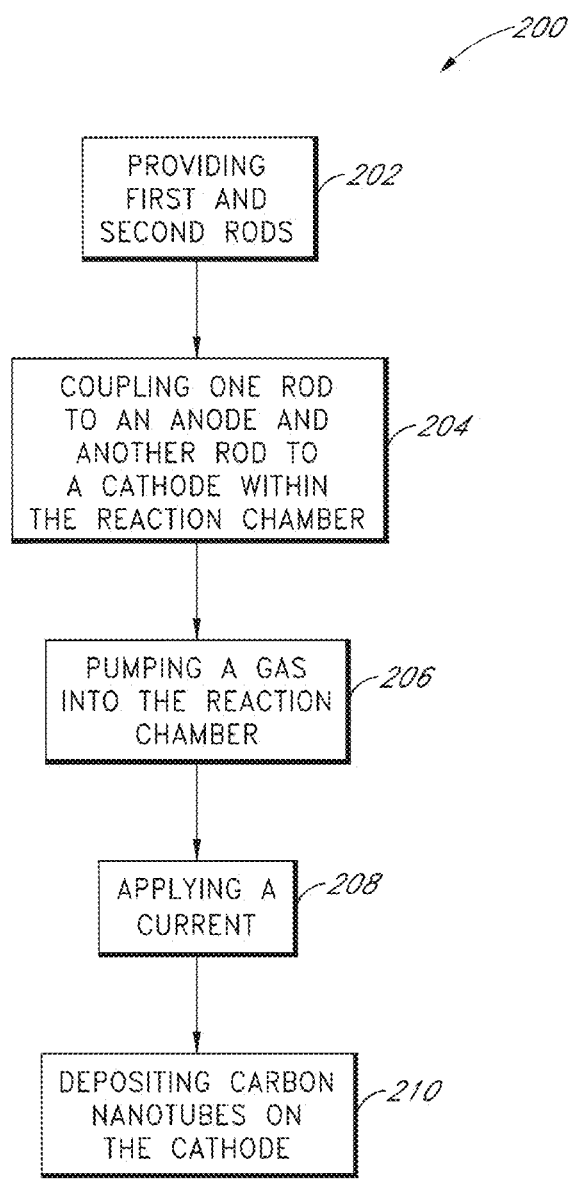
FIG. 2 is a flowchart showing one example of a method for manufacturing carbon nanotubes.

FIG. 2 is a flowchart showing one example of a method for manufacturing carbon nanotubes 200. The method for manufacturing carbon nanotubes 200 includes: an operation "Providing first and second rods," illustrated in block 202; an operation "Coupling one rod to an anode and another rod to a cathode within the reaction chamber," illustrated in block 204; an operation "Pumping a gas into the reaction chamber," illustrated in block 206; an operation "Applying a current," as illustrated in block 208; an operation "Depositing carbon nanotubes on the cathode," as illustrated in block 210. Although operations 202, 204, 206, 208, and 210 may be performed sequentially, it will be appreciated that one or more of these operations may be performed at about the same time. These operations may also be performed in a different order than is depicted in FIG. 2.

At operation 202 "Providing first and second rods," appropriate rods are provided for performing arc discharge. The first rod can be coupled to an anode and the second rod can be coupled to a cathode within the reaction chamber 204. Of course, the rods may be coupled in any order. For example, the first rod may be coupled to the anode and the second rod may be coupled to the cathode. In some embodiments, at least the first rod comprises carbonized lignin or carbonized, sulfur-containing lignin. For example, the first rod can be obtained by the process disclosed in the present application (e.g., process 100 depicted in FIG. 1). In some embodiments, at least the second rod comprises carbonized lignin or carbonized, sulfur-containing lignin. For example, the second rod can be obtained by the process disclosed in the present application (e.g., process 100 depicted in FIG. 1). In some embodiments, both the first rod and the second rod comprise carbonized lignin or carbonized, sulfur-containing lignin. For example, the first rod and the second rod can be obtained by the process disclosed in the present application (e.g., process 100 depicted in FIG. 1).

At operation 206 "Pumping a gas into the reaction chamber," a suitable gas is supplied to the chamber for performing arc discharge. The gas can be an inert gas (e.g., $N_2$, argon, xenon, krypton, or helium), $CO_2$, CO, $H_2O$, $H_2$ or mixtures thereof. The pressure in the reaction chamber is not particularly limited and can be, for example, about 0.0001 atm to about 10 atm. In some embodiments, the pressure can be about 1 atm or less. In some embodiments, the pressure can be about 0.8 atm or less.

At operation 208 "Applying a current," a current is applied between the first rod and the second rod. The current may be effective to produce fullerenes within the reaction chamber. In some embodiments, the fullerenes can be produced, at least in part, from carbon within the first rod. The voltage applied may vary, and can be, for example, from about 10 V to about 380 V. The voltage may, in some embodiments, be effective to produce a current from about 10 A to about 500 A between the first rod and the second rod. The current may be applied to produce an alternating current or a direct current. In some embodiments, the current is applied to produce an alternating current having a frequency of about 10 Hz to about 100M Hz.

Figure 3:
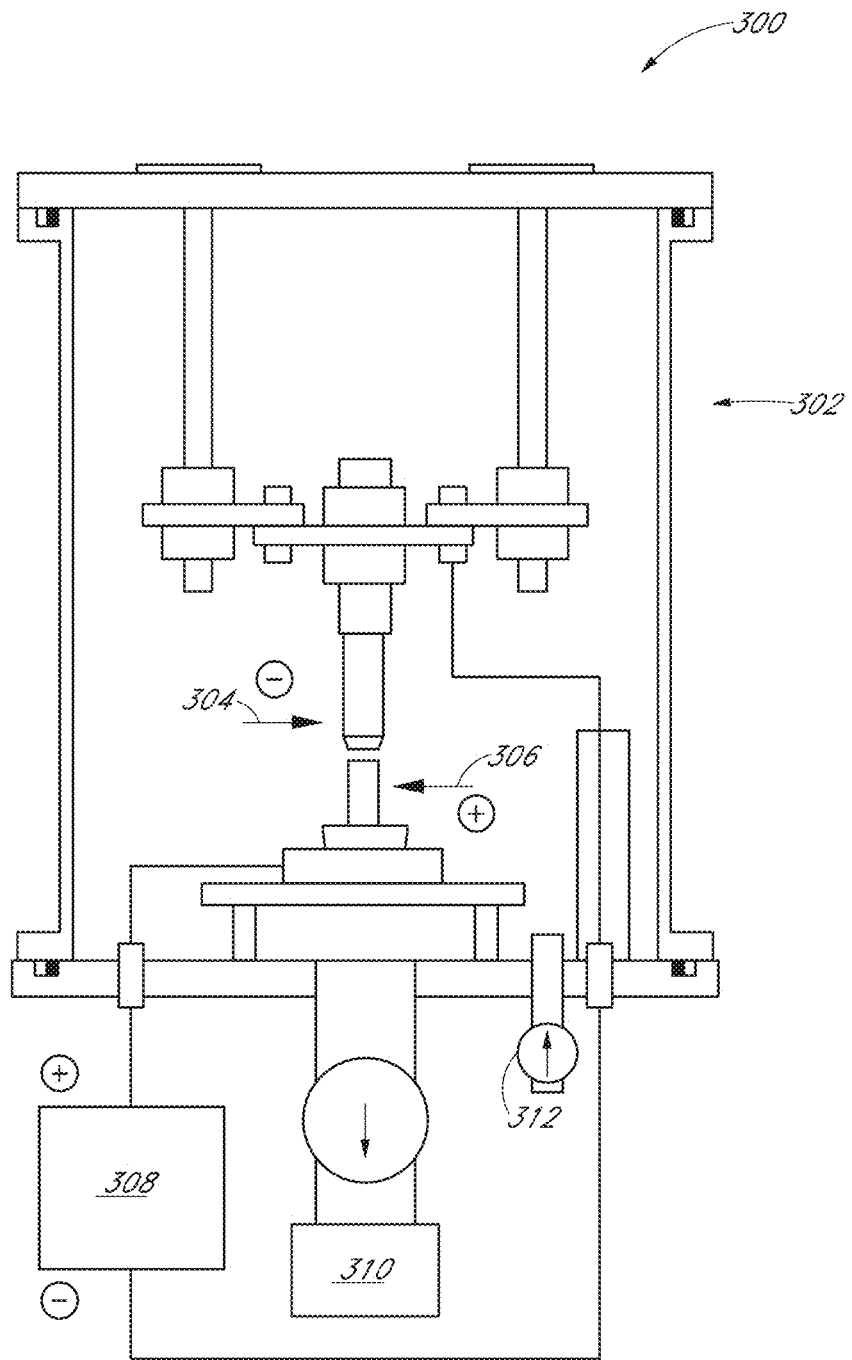
FIG. 3 shows one example of an apparatus for manufacturing carbon nanotubes by arc discharge.

FIG. 3 shows apparatus 300 which is one example of a device that can be used to manufacture carbon nanotubes by arc discharge. In some embodiments, one or both of carbon rod electrodes 304 and 306 include carbonized lignin or carbonized, sulfur-containing lignin (e.g., at least one electrode is made according to the process 100 described above with reference to FIG. 1). The carbon rod electrode used as the cathode 304 can be larger than the carbon rod electrode used as the anode 306. Gas inlet 312 may be configured for pumping a gas (e.g., an inert gas, such as $N_2$, argon, xenon, krypton, helium, or mixtures thereof) into chamber 302 (e.g., as described above with respect to operation 206 depicted in FIG. 2). Apparatus 300 also includes vacuum pump 310 configured to apply a reduced pressure. For example, vacuum pump 310 may maintain a reduced pressure from about 100 torr (0.1316 atm, 13332 kPa) to about 760 torr (1 atm, 101325 kPa) for the gas inside the reaction chamber. In some embodiments, the current that is applied (e.g., in accordance with operation 208 depicted in FIG. 2) can produce a direct current or an alternating current. The current can be supplied by generator 308.

In some embodiments, the carbon rod electrodes do not include a catalyst and the arc discharge process can produce multi-walled carbon nanotubes. In some embodiments, the carbon rod electrodes include a catalyst and the arc discharge process can produce single-walled carbon nanotubes.

In some embodiments, the fullerenes are harvested from the cathode by hand, scraper, tweezers or by using a vacuum device. If the carbon rod electrodes included a catalyst, the deposited nanotubes may include some additional impurities. Some carbon clusters included in the deposits may not contain fullerenes with the desired structure. For at least these reasons, it may be advantageous to purify the harvested carbon nanotubes. In some embodiments, purification is provided by air exposing the fullerenes to oxidizing conditions. For example, the fullerenes can be heated in air, oxygen, carbon dioxide, or mixtures thereof. The oxidation can occur at temperatures of at least about 200, 250, 300, 350, 400 or 450° C. In some embodiments, the temperature is maintained for at least about 1, 5, 10, 15, 20, 25, 30, 35, 40, 45, 50, 55, 60, 65, 70, 75, 80, 85, 90, 95, 100, 105, 110, 115 or 120 minutes.

In some embodiments, the fullerenes may be treated with an acid to improve purity. For example, the fullerenes can be refluxed with a sulfuric acid and/or nitric acid. As another example, the fullerenes can be treated with hydrochloric acid.

Other standard purification techniques may be optionally included in the processes disclosed in the present application. Consequently, the processes disclosed, herein are not limited to any particular purification technique.

In some embodiments, the purity of the fullerenes obtained by the processes disclosed in the present application may be at least about 70% to about 99%. In some embodiments, the purity is at least about 70, 75, 80, 85, 90, 95 or 99%.

The yield of carbon nanotubes can be determined by the mass of the fullerenes divided by the mass of the carbon rods. In some embodiments, the yield of the fullerenes is at least about 10, 15, 20, 25, 30, 35, 40, 45, 50, 55, 60, 65, 70, 75, 80, 85 or 90%.

In some embodiments, the fullerenes are single-walled carbon nanotubes. In some embodiments, the fullerenes are multi-walled carbon nanotubes.

WORKING EXAMPLES

Example 1—Manufacture of Single-Walled Carbon Nanotubes from Rods Made from Lignin Scrap 10 liters of lignin scrap were vaporized by heating the lignin scrap at 150° C. for about 300 minutes to obtain about 0.5 kg of residue. The residue was then mixed with 5 grams of ytterbium catalyst and 10 grams of coal tar as binder and the mixture was compressed in a mold at 3 MPa pressure. Then the compressed rods were dried at about 120° C. for about 3 hours. The rods were then carbonized by heating at about 600° C. for 300 minutes under 100 KPa $N_2$. The rods had cross-sectional diameters of about 5 mm to about 20 mm and lengths of about 10 mm to about 100 mm.

One rod was then coupled to a cathode in a reaction chamber, and another rod was coupled to an anode within the reaction chamber. The initial distance between the rods was about 2 mm. Inert gas Ar was pumped into the chamber to create a pressure of about 7 PSI (about 0.5 atm). A voltage of about 50 V was applied to produce about 30 amps of current, creating an arc between the rods. The voltage was applied for about 10 mins. About 2 grams of single-walled carbon nanotubes were harvested.

About 1 g of the resulting single-walled carbon nanotubes were oxidized at 400° C. using an air flow of about 10 mL/min for about 1 h. To eliminate metal oxide catalysts, the oxidized amount of carbon nanotubes were dispersed in 600 mL of 10 M HCl for 4 h under ultrasonic agitation, washed until the pH of the solution was neutral, and dried.

Figure 4A:
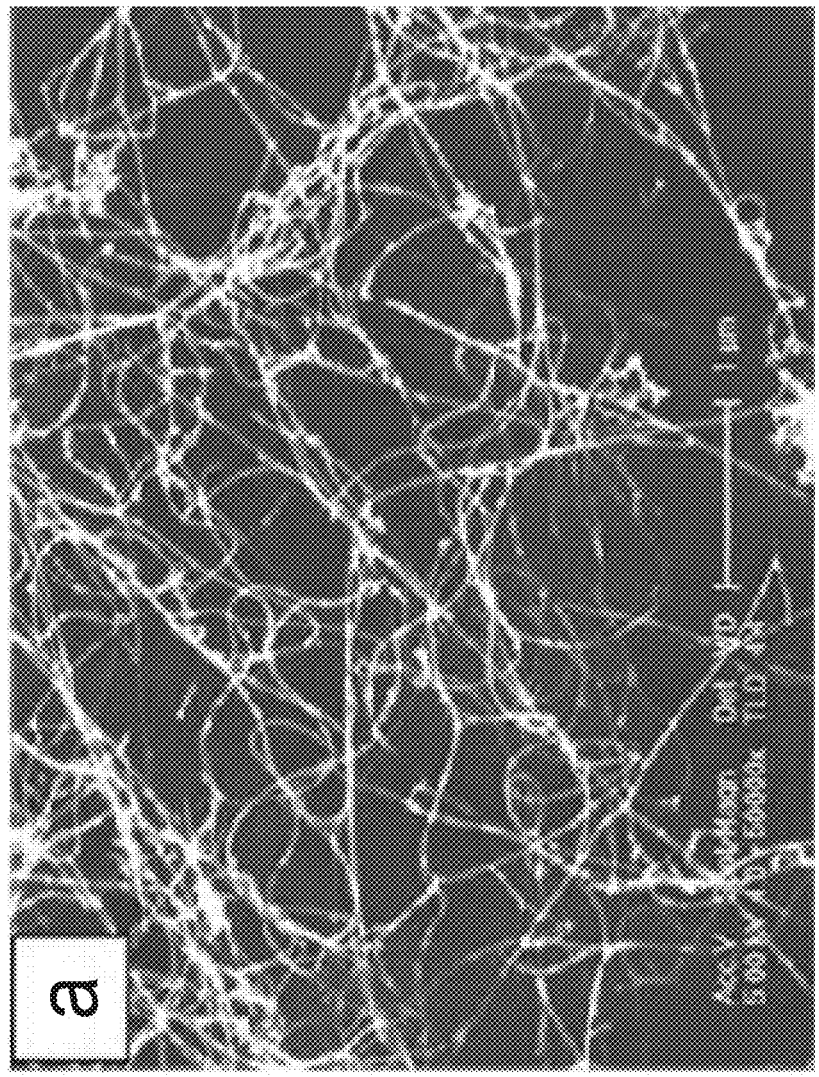
FIG. 4A shows an SEM image of single-walled carbon nanotubes manufactured by an arc discharge process using carbon rod electrodes produced from lignin scrap.

FIG. 4A is a scanning electron microscope (SEM) picture of single-walled carbon nanotubes obtained from the process in Example 1. The single-walled carbon nanotubes shown in FIG. 4A have very few impurities compared to those shown in FIG. 4B (below). Accordingly, the carbon rod electrodes made from waste lignin scrap were unexpectedly superior to standard graphite electrodes.

Example 2—Manufacture of Multi-Walled Carbon Nanotubes Using Rods Made from Lignin Scrap The process in Example 1 is repeated excepted that the rods did not include any catalyst. The process may predominantly yield multi-walled carbon nanotubes.

Figure 4B:
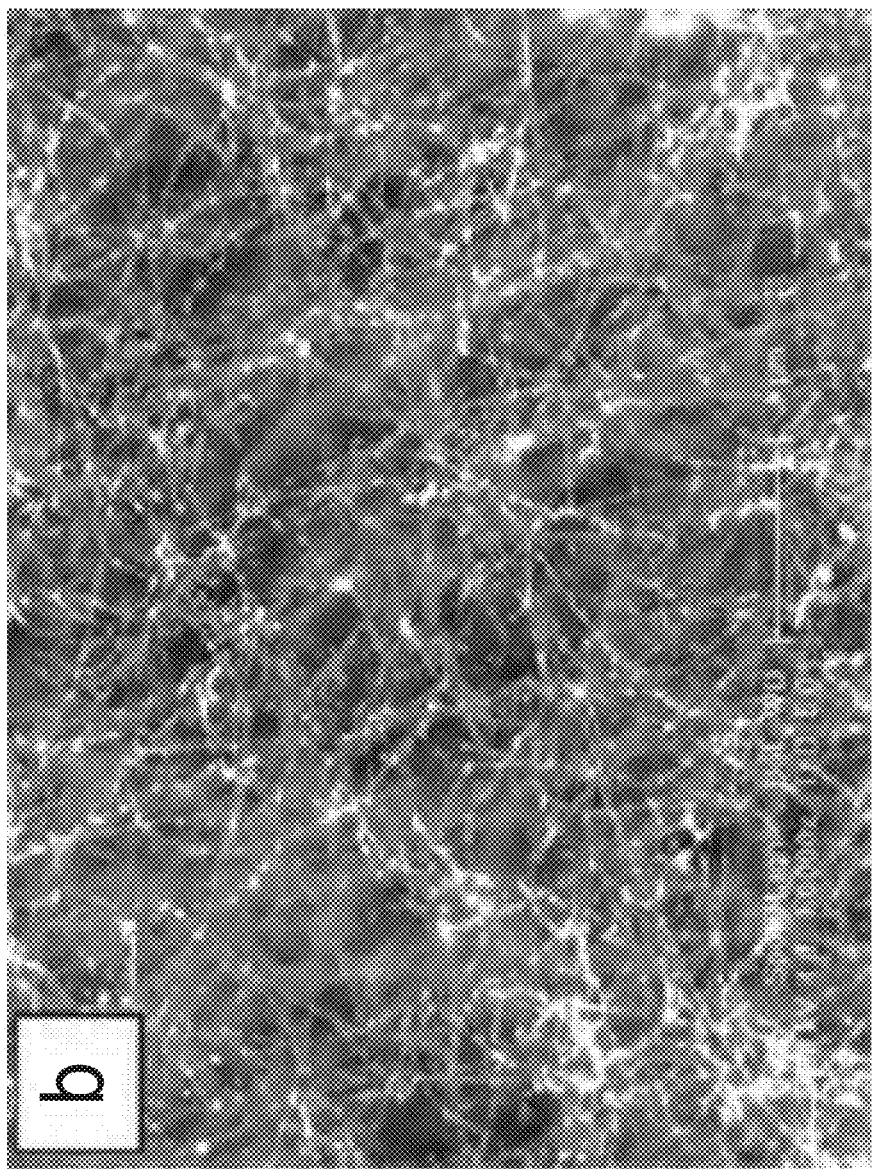
FIG. 4B shows an SEM image of single-walled carbon nanotubes manufactured by an arc discharge process using standard graphite electrodes.

Comparative Example 1—Manufacture of Single-Walled Carbon Nanotubes Using Standard Graphite Rods The process in Example 1 was repeated except that standard graphite rods containing catalyst were used as the carbon source. FIG. 4B is a scanning electron microscope (SEM) picture of single-walled nanotubes obtained from the process in Comparative Example 1. The SEM image shows many impurities, further demonstrating the superior results from the rods made of lignin scrap.

Comparative Example 2—Manufacture of Multi-Walled Carbon Nanotubes Using Standard Graphite Rods The process in Comparative Example 1 is repeated except that the standard graphite rods did not include any catalyst. The process may predominantly yield multi-walled carbon nanotubes with greater impurities relative to Example 2.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for producing carbon rods, the method comprising:
    vaporizing a solution or suspension comprising sulfur-containing lignin to form a residue;
    combining the residue with a catalyst to form a mixture;
    compressing the mixture to form one or more rods;
    drying the rods; and
    carbonizing the dried rods to produce carbon rods.

2. The method of claim 1, wherein the solution or suspension is black water from a paper manufacturing process.

3. The method of claim 1, wherein the solution or suspension comprises at least about 0.1% to about 30% by weight sulfur-containing lignin.

4. The method of claim 1, wherein vaporizing the solution or suspension comprises heating the solution or suspension under a vacuum at a temperature of about 20° C. to about 300° C.

5. The method of claim 1, wherein the residue comprises at least about 40% to about 99% by weight lignin.

6. The method of claim 1, wherein compressing the mixture comprises applying a pressure of about 100 kPa to about 10,000 kPa.

7. The method of claim 1, wherein the catalyst comprises one or more selected from the group consisting of Fe, Co, Ni, Yb, Cu, Au, Al, Si, Rh, Mn, Zn, Mg, Mo, Ru, and Ti, or an oxide thereof.

8. The method of claim 1, wherein the catalyst is present in the mixture at a concentration of about 0.01% to about 30% by weight.

9. The method of claim 1, wherein the one or more carbon rods have cross-sectional diameters of about 5 millimeters to about 5 centimeters.

10. The method of claim 1, wherein the one or more carbon rods have lengths of about 5 millimeters to about 1 meter.

11. The method of claim 1, wherein drying the rods comprises heating the rods under a vacuum or under an inert gas at a temperature of about 40° C. to about 600° C.

12. The method of claim 1, wherein carbonizing the dried rods comprises heating the dried rods under a vacuum or under an inert gas at a temperature of about 600° C. to about 3000° C.

13. The method of claim 1, wherein the carbon rods comprise at least about 0.01% to about 30% by weight sulfur.

14. The method of claim 13, wherein the sulfur is substantially uniformly distributed in the carbon rods.

* * * * *

UNITED STATES PATENT AND TRADEMARK OFFICE
CERTIFICATE OF CORRECTION

PATENT NO. : 9,771,265 B2
APPLICATION NO. : 14/408928
DATED : September 26, 2017
INVENTOR(S) : Wei et al.

It is certified that error appears in the above-identified patent and that said Letters Patent is hereby corrected as shown below:

In the Specification

In Column 1, Line 5, delete "APPLICATON" and insert -- APPLICATION --, therefor.

In Column 1, Line 9, delete "filed Jun. 27, 2012" and insert -- filed on Jun. 27, 2012 --, therefor.

Signed and Sealed this
Fifth Day of December, 2017

Joseph Matal
*Performing the Functions and Duties of the
Under Secretary of Commerce for Intellectual Property and
Director of the United States Patent and Trademark Office*